(12) United States Patent
Benzoni et al.

(10) Patent No.: US 10,522,975 B2
(45) Date of Patent: Dec. 31, 2019

(54) INCREASING ACCURACY IN THE WAVELENGTH OF SEMICONDUCTOR LASERS

(71) Applicant: Mellanox Technologies Silicon Photonics Inc., Monterey Park, CA (US)

(72) Inventors: Albert Michael Benzoni, South Pasadena, CA (US); Bhavin Bijlani, Glendora, CA (US); Amir Ali Tavallaee, Los Angeles, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 11 days.

(21) Appl. No.: 15/632,264

(22) Filed: Jun. 23, 2017

(65) Prior Publication Data

US 2018/0375288 A1 Dec. 27, 2018

(51) Int. Cl.
| | | |
|---|---|---|
| *H01S 5/22* | (2006.01) |
| *H01S 5/026* | (2006.01) |
| *H01S 5/00* | (2006.01) |
| *H01S 5/40* | (2006.01) |
| *H01S 5/10* | (2006.01) |
| *H01S 5/12* | (2006.01) |
| *H01S 5/02* | (2006.01) |

(52) U.S. Cl.
CPC ............. *H01S 5/22* (2013.01); *H01S 5/005* (2013.01); *H01S 5/0042* (2013.01); *H01S 5/026* (2013.01); *H01S 5/1085* (2013.01); *H01S 5/4087* (2013.01); *H01S 5/0202* (2013.01); *H01S 5/12* (2013.01); *H01S 2301/02* (2013.01)

(58) Field of Classification Search
CPC ........................................................ H01S 5/22
See application file for complete search history.

(56) References Cited

U.S. PATENT DOCUMENTS

2003/0095737 A1* 5/2003 Welch .................... B82Y 20/00
385/14

\* cited by examiner

*Primary Examiner* — Sung H Pak
*Assistant Examiner* — Hoang Q Tran
(74) *Attorney, Agent, or Firm* — Gavrilovich, Dodd & Lindsey, LLP

(57) ABSTRACT

An optical system includes a laser die that includes a gain medium and multiple laser waveguides that are each configured to guide a different laser light signal through the gain medium. Each of the laser waveguides outputs a laser light signal at a wavelength. The laser waveguides are arranged in multiple candidate groups. Each candidate group includes multiple laser waveguides. The wavelength spacing of the laser waveguides is the same or substantially the same in different candidate groups.

20 Claims, 5 Drawing Sheets

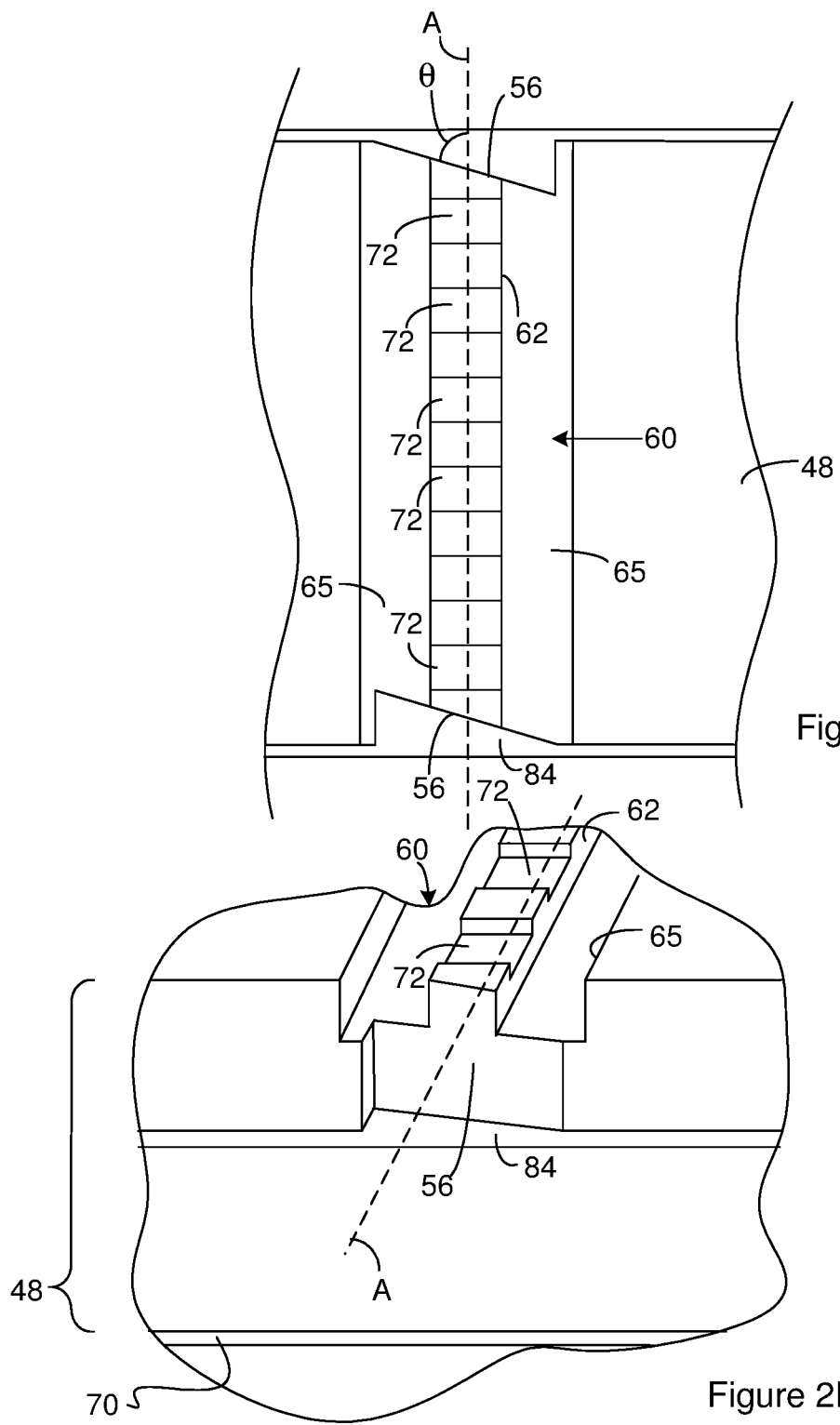

INCREASING ACCURACY IN THE WAVELENGTH OF SEMICONDUCTOR LASERS

FIELD

The present invention relates to optical devices and particularly, to semiconductor lasers.

BACKGROUND

Lasers chips commonly include one or more lasers that each acts as a light source for a planar optical device. The laser dies are generally fabricated separate from the optical device and then attached to the optical device at a later time. These optical devices are generally designed to operate with one or more light signals (optical channels) that each has an operating wavelength within a very narrow wavelength range. As a result, the optical devices are matched with laser dies designed to produce light signals with wavelengths within those narrow ranges. However, the wavelength that is actually realized (realized wavelength) in the optical device is often different from the wavelength at which a laser is designed to operate (design wavelength). This mismatch can increase as the number of optical channels on the laser die increases and/or the spacing of the optical channels decreases. When the realized wavelength falls outside a narrow band of wavelengths, the laser die and optical device are considered waste because the laser die is generally attached to the optical device with a solder epoxy or other non-reworkable adhesive. Accordingly, there is a need for laser dies that can provide an improved agreement between the design wavelength and the wavelength that is actually realized in the optical device.

SUMMARY

An optical system includes a laser die that includes a gain medium and laser waveguides that are each configured to guide a different laser light signal through the gain medium. Each of the laser waveguides emits a laser light signal having a center wavelength. The laser waveguides are arranged in multiple candidate groups. Each candidate group includes multiple laser waveguides. The spacing of the center wavelengths associated with the laser waveguides is the same or substantially the same in different candidate groups.

The laser waveguides each terminate at a facet through which the laser light signal exits from the laser waveguide. One or more of the facets are non-perpendicular relative to an optical axis of the laser waveguide terminated by the one or more facets. In some instances, the facets are not co-planar with any crystal planes of the gain medium.

BRIEF DESCRIPTION OF THE FIGURES

FIG. 2A is a bottom view of the laser die.

FIG. 2B is a cross-section of the laser die shown in FIG. 2A taken along the line labeled B in FIG. 2A.

FIG. 2C is a cross-section of the laser die shown in FIG. 2A taken along the line labeled C in FIG. 2A.

FIG. 2D is a topview of the laser die.

FIG. 2E and FIG. 2F show more detail regarding the construction of the facets and/or grating of the laser die illustrated in FIG. 2A through FIG. 2D. FIG. 2E is a topview of a portion of the laser die that includes a facet.

FIG. 2F is a perspective view of the portion of the laser die shown in FIG. 2E.

FIG. 3A is a topview of a portion of a wafer on which multiple laser dies are formed. The ridges for laser waveguides are formed on the illustrated portion of the wafer.

FIG. 3B is a topview of the portion of the portion of the wafer shown in FIG. 3A after formation of a mask on the wafer of FIG. 3A.

FIG. 3C is a topview of the portion of the portion of the wafer shown in FIG. 3B after etching of the wafer and removal of the mask.

FIG. 3D is a topview of the portion of a laser die formed as a result of separating the laser die from other laser dies on the wafer and/or from the wafer.

DESCRIPTION

Figure 1A:
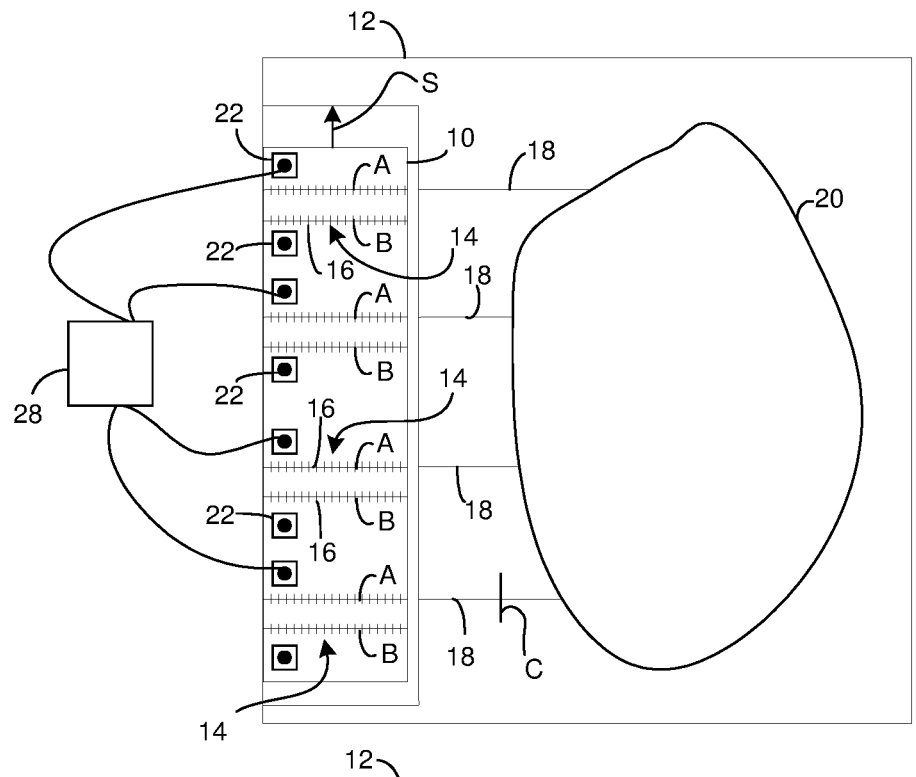
FIG. 1A is a schematic of an optical system that includes a laser die mounted on a planar optical device.

An optical system includes a laser die mounted on an optical device that includes one or more device waveguides. The laser die includes multiple laser waveguides that are each configured to output a laser light signal. At least a portion of the laser waveguides are each optically aligned with one of the device waveguides; however, a portion of the laser waveguides are active lasers and another portion of the laser waveguides are inactive. During operation of the system, the active lasers output light signals but the inactive lasers do not output light signals. Accordingly, there are more laser waveguides on the laser die than are needed to provide the number of laser light signals needed by the optical device.

On a single laser die there are several laser waveguides that are each associated with one of the active lasers in that each of the several waveguides is a candidate to be the active laser. Each of the laser waveguides associated with an active laser is designed to output a light signal that has a particular wavelength in an optical device (the design wavelength). The design wavelengths are at or near the target wavelength of the associated active laser. However, multiple laser dies are fabricated on a single wafer. Fabrication variations across the wafer cause the light signal that is actually realized in the optical device to have a wavelength (the realized wavelength) other than the design wavelength. As a result, the laser waveguides are each tested to determine the realized wavelength. The laser waveguides or collection of laser waveguides that provide realized wavelengths closest to their target wavelengths are selected as the active lasers and the remaining candidates become inactive lasers. The ability to properly select or screen the emitted wavelength of a laser waveguide from among several candidates improves the agreement between the target wavelengths and the realized wavelengths and can increase yield.

As described, the use of multiple candidates for each active laser can help overcome variations in the fabrication process of laser dies, however, selecting the candidate(s) that will become the active laser still requires testing. However, testing of laser dies is one of the biggest sources of uncertainty between the realized wavelength and the target wavelength. For instance, when testing laser waveguides it is often desirable that the light signals exit the laser waveguide and then travel through air before being received at wavelength testing equipment. Even when an anti-reflective coating is positioned on the facet of the laser waveguide, the air can cause enough back reflection at the facet of the laser waveguide that the back-reflected light begins to interfere with the operation of the laser waveguide. The inventors have found that this interference causes the wavelength of the light signal output by the laser waveguide to shift. Once the laser die is attached to the optical device, the light signal no longer travels through air and instead travels through a higher refractive index medium and the amount of back reflection into the laser is reduced. As a result, the wavelength no longer experiences the wavelength shift that occurred during testing. Since the wavelength shift has been removed the testing wavelength does not match the realized wavelength.

The inventors have found that accurate testing of the laser waveguides in air can be achieved by reducing or eliminating the deleterious effects of back-reflection at the facet interface on the operation of the laser. For instance, if the laser waveguide facet is sufficiently angled relative to the optical axis of the laser waveguide such that the back reflection is reduced and accordingly does not interfere with the emission wavelength of the laser. Under these circumstances, the testing wavelength does not show the effects of the wavelength shift that occurred from back reflection. Accordingly, the testing wavelength more accurately reflect the realized wavelength.

The facets of the laser waveguide can be given the desired angles using typical methods such as cleaving or dicing of the gain medium and/or by angling the waveguide layout to the crystalline cleave planes. However, these techniques separate the gain medium along the crystal faces of the gain medium. In order to use dicing and/or cleaving to form facets that have the desired angle relative the optical axis of a laser waveguide, the laser waveguide must be precisely positioned relative to the crystal planes on the gain medium. Etching can be used to form the facets at the desired angles but without the precise alignment requirements. Since deep etching is not readily practical for separating the laser dies from the wafer, common techniques such as dicing and/or cleaving can be used to separate the laser dies after etching the facets. As a result, etching the facets can add an additional step of technical complexity to fabrication of the laser die, but the improvement in operational efficiency realized by removing the tedious process of singulation to bar and bar level coating of the laser facets, bar to die singulation and allows wafer level testing of all die versus bar level testing.

FIG. 1A is a schematic of an optical system that includes a laser die 10 mounted on an optical device 12. The laser die 10 includes laser waveguides 14 that each includes a laser cavity and is each configured to output a laser signal. For instance, the illustrated laser waveguides 14 each includes an optical grating 16 configured to provide a Distributed Feedback (DFB) laser cavity within the laser waveguide 14. Suitable optical gratings 16 for use in the laser cavities include, but are not limited to, Bragg gratings 16.

The optical device 12 is within the class of optical devices known as planar optical devices. Planar optical devices typically include one or more waveguides immobilized relative to a substrate or a base. The direction of propagation of light signals along the waveguides is generally parallel to a horizontal plane of the optical device. Examples of a horizontal plane of the optical device include the topside of the base, the bottom side of the base, the topside of the substrate, and/or the bottom side of the substrate.

The illustrated optical device 12 includes device waveguides 18. A portion of the laser waveguides 14 are optically aligned with the device waveguides 18 such that the device waveguides 18 each receive a light signal from the aligned laser waveguide 14. The device waveguides 18 guide the received light signals from the laser waveguides 14 to one or more optical components 20 positioned on the device. Example components 20 passive and active optical components such as amplifiers, switches, multiplexers, demultiplexers, power splitters/taps, variable optical attenuators. The components 20 can additionally or alternately include electrical components including light sensors such as photodiodes, electrical circuits, resistors, capacitors and transmission lines.

The laser die 10 includes multiple contact pads 22. Each contact pad 22 is associated with one of the laser cavities in that electrical energy applied between the contact pad 22 and a second terminal (not illustrated) causes the associated laser waveguide 14 to output a light signal. The system includes electronics 26 that operate certain laser waveguides by applying electrical energy between certain contact pads 22 and the second terminal. The portion of the laser waveguides 14 labeled B are inactive lasers in that the electronics 26 do not operate them so as to generate the light signals. In FIG. 1A, the inactive lasers are not aligned with one of the device waveguides 18. The portion of the laser waveguides 14 labeled B are active lasers. During operation of the optical system, the electronics operate the active lasers so as to generate a light signal that is received by one of the device waveguides 18.

The inactive lasers are operational as laser waveguides 14 but the electronics are not in electrical communication with them and accordingly cannot operate them so as to generate light signals. Alternately, the laser waveguides 14 are in electrical communication with the inactive lasers but the electronics do not operate the inactive lasers so as to generate light signals during the operation of the optical system.

The laser waveguides 14 are positioned on the laser die 10 in candidate groups. In FIG. 1A, each candidate group includes a laser waveguide 14 labeled A and a laser waveguide 14 labeled B. Each member of a candidate group is a candidate for being an active laser. For instance, the spacing between each of the laser waveguides 14 in a candidate group can be the same in each of the candidate groups. As an example, the physical space between a laser waveguide 14 labeled A and a laser waveguide 14 labeled B in one of the candidate groups applies to each of the candidate groups. As a result of this spacing, the inactive lasers shown in FIG. 1A could each have been aligned with one of the device waveguides 18 at the time the laser die 10 was attached to the optical device 12. For instance, as shown by the arrow labeled A in FIG. 1A, the laser die 10 could have been shifted such that each of the laser waveguides 14 labeled B is optically aligned with a device waveguide 18 and each of the laser waveguides 14 labeled A becomes an inactive laser. In the case of such a shift, electrical communication would be provided between the electronics and the laser waveguides 14 labeled B rather than the between the electronics and the laser waveguides 14 labeled A. The electronics can then operate the laser waveguides 14 labeled B so as to generate light signals. Accordingly, the laser waveguides 14 that are shown as active lasers in FIG. 1A would shift to become inactive lasers and the laser waveguides 14 that are shown as inactive lasers in FIG. 1A would shift to become active lasers.

In an alternative to the system illustrated in FIG. 1A, the electronics are in electrical communication with each of the laser waveguides 14 on the laser die 10. In these instances, the electronics operate the active lasers so as to generate light signals during operation of the system but do not operate the inactive lasers so as to generate light signals.

Although FIG. 1A shows two laser waveguides 14 in each of the candidate groups, each of the candidate groups can include more than two laser waveguides 14. Each of the different candidate groups is associated with a target wavelength ($\lambda_T$). The target wavelength for a candidate group is the wavelength that is desired for the active laser selected from that group. The targets wavelengths associated with different groups can be the same or different.

The laser waveguides 14 in the same candidate group can each be constructed differently. For instance, each laser waveguide 14 in a group can be designed to generate a light signal having a different wavelength in an optical device. In some instances, each of the design wavelengths is different for each laser waveguide 14 in a candidate group. The design wavelengths for each candidate group can be selected such that the target wavelength for the candidate group is between the design wavelengths for the candidate group and/or between the maximum design wavelength for the candidate group and the minimum design wavelength for the candidate group. For instance, each candidate group can include laser waveguides indexed from j=1 to N and the design wavelength for laser waveguide j ($\lambda_j$) can be $\lambda_j = \lambda_T - (\Delta\lambda/2) + (j-1)\Delta\lambda/(N-1)$ where $\lambda_T$ is the target wavelength for the candidate group, N is the total number of laser waveguides included in the candidate group and $\Delta\lambda$ represents the maximum design wavelength in the candidate group minus the minimum design wavelength for the candidate group. In the above equation, the index j refers to the relative positions of different laser waveguides on the wavelength spectrum rather than to the physical location of the laser waveguides within the candidate group. In some instances, $\Delta\lambda$ is greater than 0.0 nm, 0.5 nm, 0.75 nm, or 1 nm and/or less than 3.2 nm, 6.4 nm, or 19.2 nm. The $\Delta\lambda$ values of 3.2 nm, 6.4 nm, or 19.2 nm can respectively correspond to a 400 GHz, 800 GHz, and 2.4 THz (CWDM) channel spacing.

The design wavelength spacing in one or more of the candidate groups is the difference in the design wavelengths that are adjacent to one another on the wavelength spectrum. As a result, a candidate group with design wavelengths selected according to the above equation for $\lambda_j$ has a design wavelength spacing of $\Delta\lambda/(N-1)$. In some instances, the design wavelength spacing ($\Delta\lambda_j$) is greater than 0.0 nm, 0.5 nm, 0.75 nm, or 1 nm and/or less than 1 nm, 1.25, or 1.5 nm and can be zero. The design wavelength spacing for each pair of adjacent design wavelengths in a candidate group can be constant or variable.

The target wavelengths, $\lambda_T$, are the wavelengths that are desired for the optical channels that are to be processed by the optical device. Communications applications generally employ channels having wavelengths from 1260 nm to 1625 nm. As a result, in some instances, the target wavelengths, $\lambda_T$, are greater than 1260 nm, 1530 nm, or 1665 nm and/or less than 1360 nm, 1565 nm, or 1625 nm.

Since the target wavelengths correspond to the wavelengths that are desired for the optical channels that are to be processed by the optical device, the channel spacing corresponds with the difference between target wavelengths of candidate groups that are adjacent to one another on the wavelength spectrum (target wavelength spacing, $\Delta\lambda_T$). The channel spacing in optical communications is generally about 0.8 to 6.4 nm. In WDM applications, the channel spacing is generally about 3.2 to 6.4 nm. Accordingly, the target wavelength spacing can be greater than 0 nm, 0.5 nm, 0.75 nm, or 1 nm and/or less than 1 nm, 1.25 nm, 1.5 nm or 7.0 nm. Correspondingly, the laser die can be configured such that the difference between the maximum design wavelength of candidate groups that are adjacent to one another on the wavelength spectrum is greater than 0 nm, 0.5 nm, 0.75 nm, or 1 nm and/or less than 1 nm, 1.25 nm, 1.5 nm or 7.0 nm and/or the difference between the minimum design wavelength of candidate groups that are adjacent to one another on the wavelength spectrum is greater than 0 nm, 0.5 nm, 0.75 nm, or 1 nm and/or less than 1 nm, 1.25 nm, 1.5 nm or 7.0 nm. Accordingly, the laser die can be configured such that the difference between the maximum realized wavelength of candidate groups that are adjacent to one another on the wavelength spectrum is greater than 0 nm, 0.5 nm, 0.75 nm, or 1 nm and/or less than 1 nm, 1.25 nm, 1.5 nm or 7.0 nm and/or the difference between the minimum realized wavelength of candidate groups that are adjacent to one another on the wavelength spectrum is greater than 0 nm, 0.5 nm, 0.75 nm, or 1 nm and/or less than 1 nm, 1.25 nm, 1.5 nm or 7.0 nm.

The above values for $\Delta\lambda_T$, $\Delta\lambda$, $\Delta\lambda_j$ and $\lambda_T$ can apply when the above equation for $\lambda_j$ is used or when the design wavelengths of different laser waveguides is determined by some other relationship. Although the above discussion discloses the design wavelengths for the laser waveguide in a candidate group as being different from one another, two or more of the laser waveguides in a candidate group can have the same design wavelength.

The laser die can be constructed such that a laser waveguide in a candidate group corresponds to a laser waveguide in other candidate groups. For instance, in FIG. 1A, each of the laser waveguides labeled A corresponds to the laser waveguides labeled A in each of the other candidate groups. Additionally, each of the laser waveguides labeled B corresponds to the laser waveguides labeled B in each of the other candidate groups. Corresponding laser waveguides occupy the same physical space in the different candidate groups. For instance, the leftmost laser waveguide in one candidate group corresponds to the leftmost laser waveguide in another candidate group. As another example, the third laser waveguide in one candidate group corresponds to the third laser waveguide in another candidate group. When the candidate groups include corresponding laser waveguides, the pattern of the design wavelength spacing in the different candidate group can be the same. For instance, the design wavelength spacing can be $\Delta\lambda/(N-1)$ in multiple different candidate groups.

As another example, when the candidate groups include corresponding laser waveguides, difference between the design wavelength for a laser waveguide and the associated target wavelength ($\lambda_j - \lambda_T$) can be the same for corresponding laser waveguides in different candidate group. As an example, using the equation for $\lambda_j$ presented above, the difference between a design wavelength and the associated target wavelength can be represented by $\lambda_j - \lambda_T = (j-1)\Delta\lambda/(N-1) - (\Delta\lambda/2)$. In this example, $\lambda_T$ can be different for different candidate groups. Alternately, $\lambda_T$ can be the same for one or more of the candidate groups. In this example, the index j indicates corresponding laser waveguides. For instance, each of the laser waveguides with the index of j=3 is a corresponding laser waveguide. This example illustrates that the difference between the design wavelength of corresponding waveguides is constant for each pair of corresponding laser waveguide in two different candidate groups that include corresponding laser waveguides. For instance, each pair of corresponding laser waveguides in two different candidate groups can have design wavelengths that differ by the target wavelength spacing, $\Delta\lambda_T$. This condition can be true for one, more than one or all pairs of candidate groups included in the laser die.

The design wavelength for a laser waveguide 14 can be tuned using a number of different mechanisms. For instance, when the laser waveguides 14 each include a DFB cavity as shown in FIG. 1A, the pitch of the Bragg gratings 16 can be selected to produce the target wavelength. As a result, the pitch of the Bragg gratings 16 for different laser waveguide 14 in a candidate group can be different.

Multiple laser dies are generally fabricated on a single wafer. Due to variations in the fabrication process across the wafer, the wavelength of the light signal that is actually realized in the optical device (realized wavelength) is generally different from the design wavelength for that laser waveguide 14. Since the design target wavelength can be between the design wavelength, one of the laser waveguides 14 will generally produce a wavelength that is closer to the target wavelength than the other laser waveguides 14 in the candidate group. The laser waveguide 14 or collection of laser waveguides 14 that produce light signals with realized wavelengths that are closest to the associated target wavelengths are selected to act as the active lasers.

The laser waveguides 14 that are to be active lasers can be selected before the laser die 10 is attached to the optical device 12 so the proper alignment can be made. For instance, a wafer can be constructed having multiple laser dies 10. The laser dies 10 can be separated from one another and from the wafer by techniques such as cleaving. The laser waveguides 14 on each of the devices can be tested before separating the laser dies 10 from the wafer or between separating the laser dies 10 from the wafer and attaching them to the optical device 12.

The testing of a laser waveguide 14 can be performed by operating the laser waveguide 14 such that the laser waveguide 14 generates a light signal. An optical fiber (or other appropriate optical element) is positioned to receive the light signal. The optical fiber guides the received light signal to wavelength testing electronics and/or optoelectronics (both called wavelength testing optoelectronics below) that determine the wavelength of the received light signal. The wavelengths that are determined for the laser waveguides 14 in each of candidate groups can be compared to the associated group design wavelengths in order to select the laser waveguides 14 and/or candidate group that will become active lasers. However, in the system of FIG. 1A, laser waveguides 14 cannot be individually selected to be laser waveguides 14. For instance, a combination of laser waveguides 14 labeled A and laser waveguides 14 labeled B cannot be selected to be active lasers. Accordingly, the collection of laser waveguides 14 that will serve as active lasers are selected. For instance, the laser waveguides 14 labeled A are selected or the laser waveguides 14 labeled B are selected.

The collection of laser waveguides 14 that produce realized wavelengths that most closely match their associated target wavelengths are selected to be active lasers. The difference between the realized wavelengths and the design wavelengths tends to be the same or substantially the same for each laser waveguide on a laser die, i.e. there is some slow variation over the wafer and this effect is relatively small over the area of one laser chip. As a result, when a laser waveguide labeled A from one of the candidate groups is closer to the target wavelength than the laser waveguide labeled B from the same candidate group, that it is generally the case that all of the candidate groups. In other words, when the laser die is constructed so as to have corresponding laser waveguides and one of the laser waveguides in a candidate group has the realized wavelength that is closest to the target wavelength, the corresponding laser waveguides in other candidate groups will generally also be closest to the target wavelength, with occasional fabrication and/or material defects aside. Accordingly, once the laser waveguides in a candidate group has the realized wavelength that is closest to the target wavelength, that laser waveguide and any corresponding laser waveguides are selected to be the active laser waveguides.

As noted above, the difference between the design wavelength of corresponding waveguides can be constant for each pair of corresponding laser waveguide in a pair of candidate groups. Since the difference between the realized wavelengths and the design wavelengths tends to be the same or substantially the same for each laser waveguide on a laser die, the difference between the realized wavelength of corresponding waveguides can be constant or substantially constant for each pair of corresponding laser waveguide in a pair of candidate groups. For instance, each pair of corresponding laser waveguides in a pair of candidate groups can have realized wavelengths that differ by the target wavelength spacing, $\Delta\lambda_T$. This condition can be true for one, more than one or all pairs of candidate groups included in the laser die. For the same reason, the realized wavelength spacing can correspond to the design wavelength spacing. For instance, the realized wavelength spacing can be the same or substantially the same as the design wavelength spacing ($\Delta\lambda_j$).

Figure 1B:
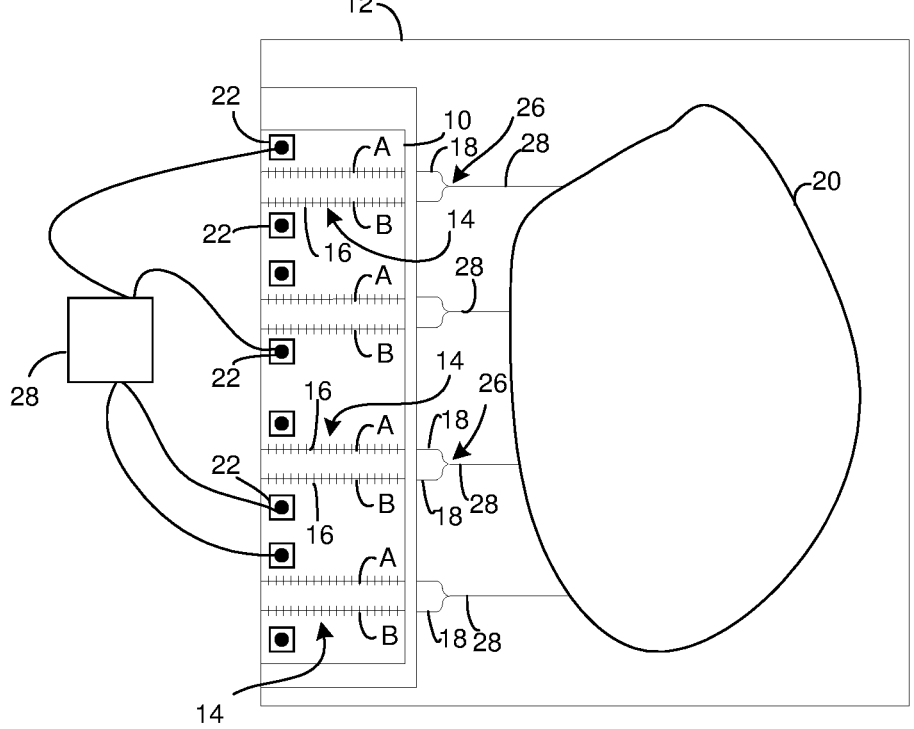
FIG. 1B is a schematic of an optical system that includes a laser die mounted on a planar optical device.

FIG. 1B is a schematic of an optical system where individual laser waveguides 14 can be selected to be active lasers. In FIG. 1B, the optical device 12 includes device waveguides 18 arranged such that each device waveguide 18 is aligned with each of the laser waveguides 14. Accordingly, each of the device waveguides 18 is configured to receive and guide a light signal from one of the laser waveguides 14.

The optical device 12 of FIG. 1B also includes signal combining components 26 that each combines the light signals from laser waveguides 14 in the same candidate group onto a secondary device waveguide 28. Although FIG. 1B illustrates a y-junction serving as the signal combining component 26, other signal combining components can be used. Suitable signal combining components include, but are not limited to, Arrayed Waveguide Gratings (AWG), echelle gratings, and Multimode Interference (MMI) devices.

In some instances, the electronics are in electrical communication with each of the laser waveguides 14 but operates the laser waveguides 14 that are selected as active lasers so as to generate light signals but does not operate the laser waveguides 14 that are selected to be inactive lasers. Alternately, the electronics are in electrical communication with each of the laser waveguides 14 selected to act as an active laser but not in electrical communication with the laser waveguides 14 that are inactive lasers. In either case, the light signal from the active lasers are guided to the secondary device waveguides 28. Accordingly, each of the secondary device waveguides 28 guides a light signal from one of the active lasers.

In the system of FIG. 1B, a broader range of laser waveguide 14 combinations can be selected to act as active lasers. For instance, FIG. 1B shows a portion of the laser waveguides 14 labeled A in electrical communication with the electronics and a portion of the laser waveguides 14 labeled B in electrical communication with the electronics. As a result, the secondary device waveguides 28 guide light signals from laser waveguides 14 labeled A and laser waveguides 14 labeled B. Accordingly, the laser waveguides 14 that will be active lasers can be selected individually rather selected as a collection. For instance, the laser waveguides 14 in a candidate group can each be tested to determine what wavelength is produced by each of the laser waveguides 14. The laser waveguide 14 that generates the light signal with the wavelength closest to the group design wavelength can be selected. Additionally, since the laser waveguides can be individually selected to be active lasers rather than being selected as a group, there is no need for the laser waveguides in different candidate groups to correspond with one another.

Figure 2A:
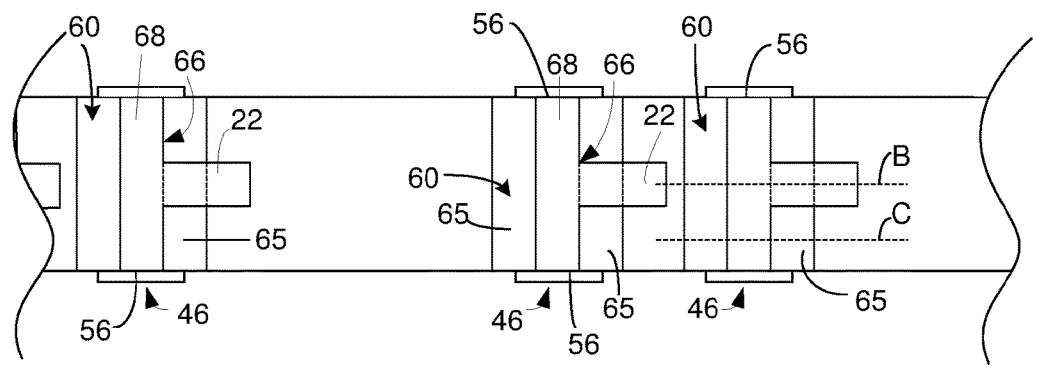
FIG. 2A through FIG. 2D illustrate a laser die that is suitable for use with an optical device constructed according to FIG. 1A through FIG. 1D.
Figure 2B:
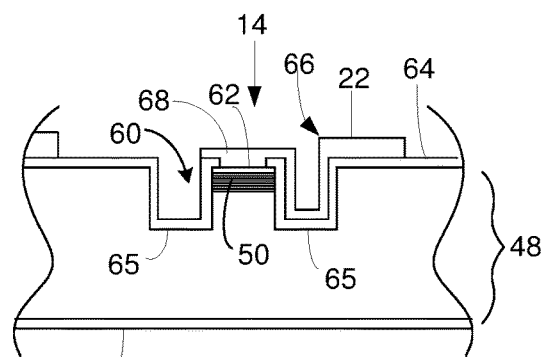
Figure 2C:
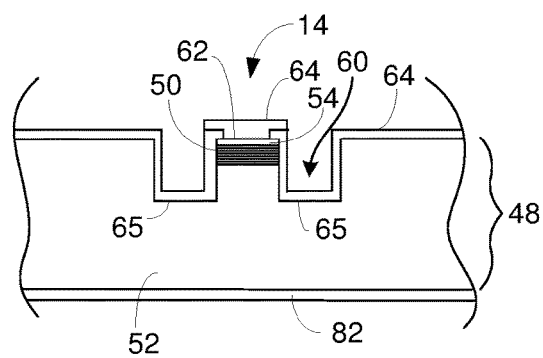
Figure 2D:
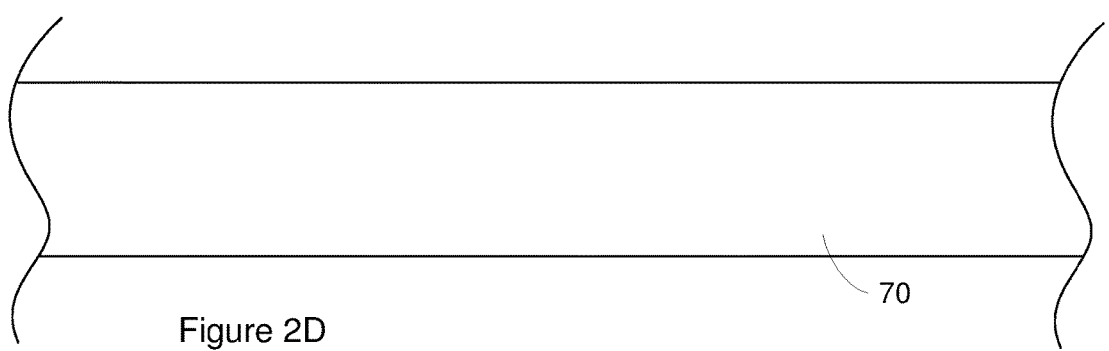

FIG. 2A through FIG. 2D illustrate a laser die 10 that is suitable for use with optical systems constructed according to FIG. 1A and FIG. 1B. FIG. 2A is a bottom view of the laser die 10. FIG. 2B is a cross-section of the laser die 10 shown in FIG. 2A taken along the line labeled B in FIG. 2A. FIG. 2C is a cross-section of the laser die 10 shown in FIG. 2A taken along the line labeled C in FIG. 2A. FIG. 2D is a topview of the laser die 10.

The laser die 10 includes multiple laser waveguides 14 defined in a gain medium 48 where light signals are lased. The gain medium 48 includes sub-layers 50 between a lower gain medium 52 and an upper gain medium 54. The lower gain medium 52 and the upper gain medium 54 can be the same or different. Suitable lower gain media include, but are not limited to, compound semiconductors such as InP, InGaAsP, and GaAs. Suitable upper gain media include, but are not limited to, InP, InGaAsP, InGaAlAs, and GaAs. In some instances, the upper gain medium 54 is optional.

Trenches 60 extend into the gain medium 48 so as to define a ridge 62 of the gain medium extending upwards from slabs 65 of the gain medium. The ridge 62 defines the laser waveguide 14 in the gain medium 48. The location of the laser mode in and/or relative to the ridge 62 is defined by the different sub-layers 50 as a result of the refractive indices of the sub-layers 50. Each of the sub-layers 50 can have a different chemical composition from the one or more immediately neighboring sub-layers 50 and/or each of the sub-layers 50 can have a different chemical composition. For instance, the sub-layers can include or consist of a dopant in the gain medium. Each sub-layer 50 can have a different dopant and/or dopant concentration from the one or more neighboring sub-layers 50 and/or each of the sub-layers 50 can have a different dopant and/or dopant concentration. As an example, each sub-layer 50 can includes or consists of two or more components selected from a group consisting of In, P, Ga, and As and different sub-layers 50 can have the elements present in different ratios. In another example, each sub-layer 50 includes or consists In, P and none, one, or two components selected from a group consisting of Ga, and As and each of the different sub-layers 50 has these components in a different ratio. Examples of materials that include multiple elements selected from the above group include different compositions of InP with or without dopants such as In(x)P(1−x) or In—Ga—As—P. Additionally, there may be other sub-layers 50 present to compensate for stress due to lattice mismatch between the compositions of the different sub-layers 50.

The laser waveguides 14 each include one or more facets 56 through which a light signal exits the laser waveguide 14. Anti-reflective coatings 63 can be positioned on the facets 56 and configured to provide the desired level of reflectivity.

A laser cladding 64 is positioned on the gain medium 48. A first electrical conductor 66 positioned on the cladding 64 includes a contact region 68 that extends through an opening in the laser cladding 64 into contact with a top of the ridge 62. The first electrical conductor 66 extends from the contact region 68 across a trench 60 to a second terminal 22. The second terminal 22 can be employed to apply electrical energy to the laser.

An electrically conducting medium 70 is positioned under the gain medium 48. The electrically conducting medium 70 can be used as a second terminal for each of the lasers when applying electrical energy to a laser.

In order to simplify FIG. 2A through FIG. 2D, the details of the laser die 10 are not shown. FIG. 2E and FIG. 2F are provided to show more detail regarding the construction of the facets 56 and/or grating 16 of the laser die 10. FIG. 2E is a topview of the laser die 10. FIG. 2F is a perspective view of a portion of the laser die 10 shown in FIG. 2E. The laser cladding 64, first electrical conductor 66, and anti-reflective coating 63 are not shown in FIG. 2D through FIG. 2F in order to illustrate the underlying portion of the laser die 10. The sub-layers 50 are also not shown in FIG. 2E and FIG. 2F. Recesses 72 extend into the top of the ridge so as to form the Bragg grating 16 in the laser waveguide 14.

The optical axis of the laser waveguide 14 is labeled A in FIG. 2E and FIG. 2F. The optical axis is parallel to the direction of propagation through the waveguide. The facets 56 are positioned at an angle $\theta$ relative to the optical axis. For instance, one or more of the facets 56 can be perpendicular to the optical axis in a first direction and positioned at an angle $\theta$ relative to the optical axis in a second direction. As an example, the facet 56 in FIG. 2E and FIG. 2F is perpendicular to the optical axis and is also at an angle $\theta$ relative to the optical axis. In some instances, the first direction is orthogonal to the second direction. The angle $\theta$ can be the lowest angle between the facet 56 and the optical axis when measured in any direction. As will be described in more detail below, the angle $\theta$ is selected such that testing of the waveguide provides an accurate measure of the wavelength of the light signal generated by the laser waveguide 14. The angle $\theta$ can be less than 90°. In some instances, the angle $\theta$ is greater than 75°, 77°, or 79°, and/or less than 81°, 83°, or 85°. The angle $\theta$ can be the same or different for different facets 56 on the same laser waveguide. The use of different angles $\theta$ for different facets 56 on the same laser waveguide can permit the device performance to be optimized.

When testing laser waveguides 14 for wavelength, it is often desirable that the light signals exit from the laser waveguide 14 and then travel through air before being received in an optical light guide (i.e. an optical fiber or other optical element) that guides the light signals to the wavelength testing optoelectronics. Even though an anti-reflective coating is positioned on the facet 56 of the laser waveguide 14, the air causes enough back reflection that the back-reflection of light into the laser cavity effectively begins to compete with reflection of light by the optical grating 16. This competition causes the wavelength that is output by the laser waveguide 14 to shift away from the realized wavelength in the actual higher index application use medium. As a result, the wavelength measured by the wavelength testing (the tested wavelength) electronics is different than the realized wavelength. The angle $\theta$ can be selected such that back-reflected light is reduced. As a result, the back reflected light does not noticeably compete with the grating 16. Importantly, the inventors have found that once the level of back reflection is reduced below a back reflection-threshold level, the shifting no longer occurs or becomes undetectable. As a result, once the level of back reflection is below the back-reflection threshold, the tested wavelength matches the realized wavelength. The inventors have found that the back-reflection tolerance threshold varies depending on the laser design and bias, but is typically less than −25 dB and can approach −50 dB range. The inventors have also found that an angle θ greater than 81°, 79°, or 77° can bring the level of back reflection below the back-reflection threshold.

Although a facet that is flat is disclosed for use in bringing the level of back-reflection below the back-reflection threshold, other geometries can be used. For instance, the facet can include a curve added to the flat shape disclosed above. As an examples, the facet can include a lens angled as disclosed above.

When the laser dies 10 are interfaced with an optical device 12 as disclosed above, the light signal generally does not pass through air when traveling from the facet 56 of the laser waveguide 14 to the aligned device waveguide 18. Instead, an index matching material is positioned between the anti-reflective coating on the facet 56 of the laser waveguide 14 and a facet 56 of the aligned device waveguide 18. An example of the index matching material is an index matching epoxy. The higher refractive index matching material produces much lower levels of back reflection than are produced by air for the given antireflective coatings. As a result, when the laser chip 10 is attached to the optical device 12 there is very little competition between back reflection at the facet 56 and grating 16 induced reflection. Accordingly, using the angle θ to reduce or eliminate the back reflection provides a more accurate approximation of the conditions that the laser waveguide 14 experiences when the laser chip 10 is attached to an optical device 12 in a higher-than-air index of refraction medium The facets 56 of the laser waveguide 14 can be etched and/or cleaved. An etched facet 56 can be distinguished from a cleaved facet because the etched facet need not be co-planar with the crystal planes. In contrast, a method such as cleaving severs the gain medium between crystal planes. As a result, one or more regions of a cleaved facet are each co-planar with one of the crystal planes of the gain medium. The ability to etch the facets 56 of the laser waveguide 14 allows the laser waveguide 14 to be formed in the gain medium without concern for the orientation relative to the crystal planes of the gain medium. In contrast, if the facets 56 of the laser waveguide 14 are to be formed by cleaving, the laser waveguides 14 need to have an orientation relative to the gain medium that allows the facets to be formed with the desired angle.

FIG. 3A through FIG. 3D illustrate a method of forming a laser die 10 according to FIG. 2A through FIG. 2F. The method is performed on a wafer of the gain medium. Multiple laser dies 10 are concurrently formed on the wafer. Using traditional planar optical device 12 fabrication technologies, the recesses 72 for the gratings 16 are formed in the gain medium. The trenches are then etched into the gain medium so as to define the ridges of the different laser waveguides 14 and provide the wafer shown in FIG. 3A.

Figure 3A:
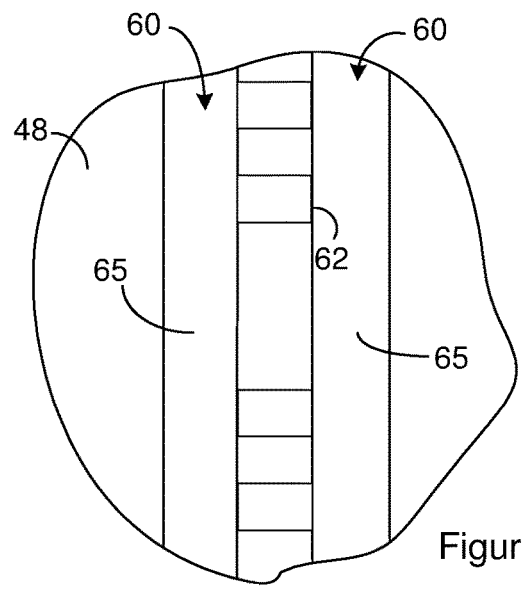
FIG. 3A through FIG. 3D illustrate a method of forming a laser die according to FIG. 2A through FIG. 2F.
Figure 3B:
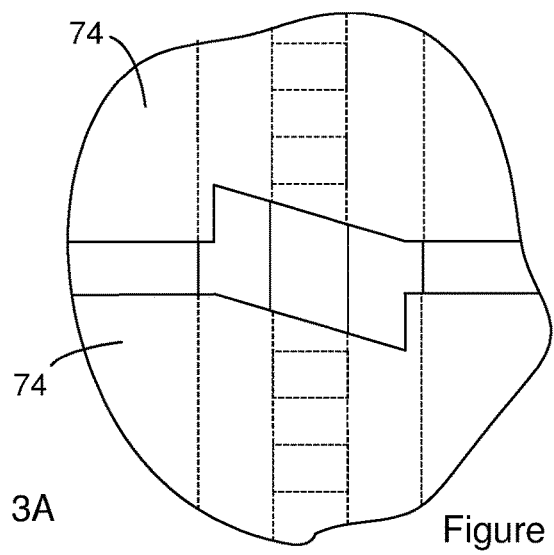

A mask 74 is formed on the wafer of FIG. 3A so as to provide the wafer of FIG. 3B. The mask 74 protects the ridges of the laser waveguides 14 and the trenches. The locations of the features under the mask 74 are shown by dashed lines. A region of the wafer located between the edges of adjacent laser dies 10 is exposed. The edges of the mask 74 are positioned at the locations that are desired for the facets 56. As a result, the angle of the etches relative to the laser waveguides 14 is evident in the mask 74. A suitable mask 74 includes, but is not limited to, a photoresist and a hard mask such as silicon dioxide or silicon nitride.

Figure 3C:
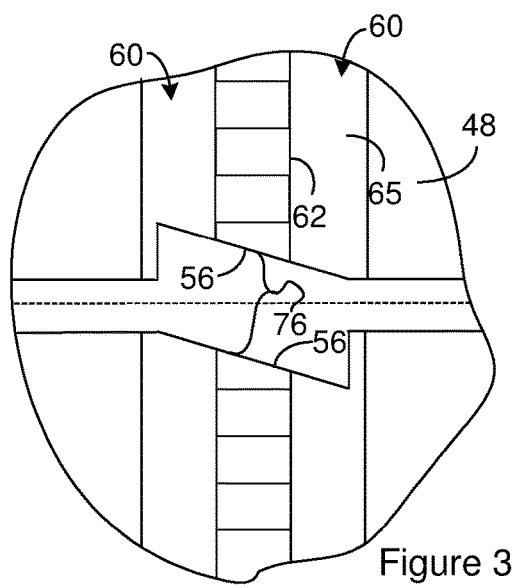

A facet etch is performed on the wafer of FIG. 3B and the mask 74 removed so as to provide the wafer of FIG. 3C. The facet etch forms a recess 76 between different laser dies 10. The sides of the recess include the facets 56 of the laser waveguides 14. As a result, the edges of the mask 74 define the locations of the facets 56 in the gain medium. The facet etch is performed for at least the duration that provides the facets 56 with the desired height. Although not shown in FIG. 3C, the anti-reflective coatings can be formed on the facets 56 of a wafer constructed according to FIG. 3C. Suitable anti-reflective coatings include, but are not limited to, one or more layers where at least one of the layers, more than one, or all of the layers include or consist of one or more components selected from the group consisting of silicon dioxide, silicon nitride, and hafnium oxide. Suitable facet etches include, but are not limited to, dry etches.

The laser dies 10 on the wafer of FIG. 3C are separated from one another and from the wafer. For instance, the wafer of FIG. 3C can be cleaved or diced along the dashed line in FIG. 3C so as to provide multiple laser dies 10 such as the laser die 10 in FIG. 3D and/or FIG. 2E through FIG. 2F. The cleaving forms a surface that serves as a lower edge of the laser die 10. Since cleaving cannot be performed flush against an existing edge of the wafer, cleaving forms a shelf 84 of the gain medium under the facets 56 of the laser waveguides 14. The facet 56 is formed with sufficient height that little or none of the laser mode passes through the cleaved surface.

Figure 3D:
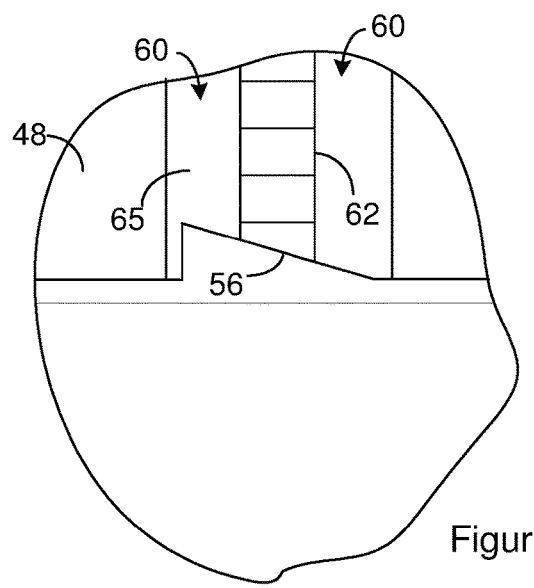

The laser die 10 of FIG. 3D is suitable for additional processing. For instance, additional components of the laser die 10 such as the laser cladding 64, first electrical conductor 66, and electrically conducting medium 70 can be formed on the laser die 10 of FIG. 3D.

Figure 4:
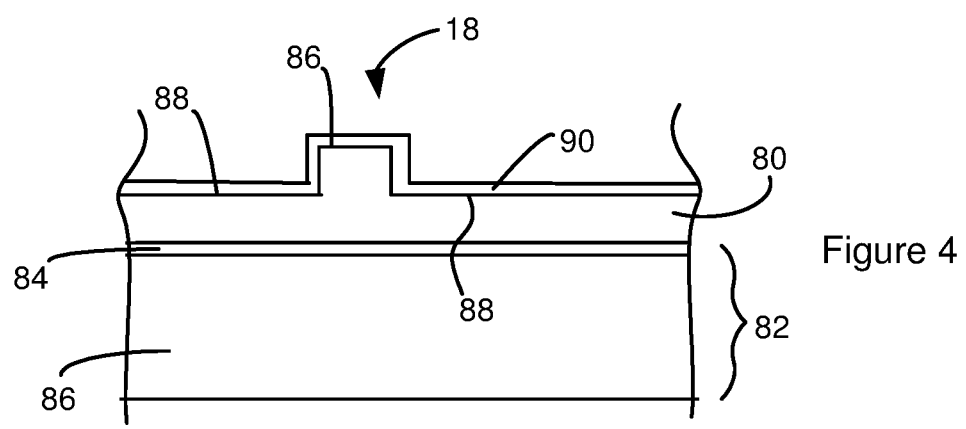
FIG. 4 is a cross section of a waveguide on an optical device.

FIG. 4 illustrates a suitable construction for the optical device 12 of FIG. 1A and FIG. 1B. FIG. 4 is a cross section of a waveguide on the device. For instance, FIG. 4 can be a cross-section of any of the device waveguides 18 or of the secondary device waveguides 28. As an example, FIG. 4 can be a cross-section of the device waveguide 18 labeled C in FIG. 1A. In one example, each of the device waveguides 18 and secondary device waveguides 28 is constructed according to FIG. 4. The device includes a light-transmitting medium 80 on a base 82 that includes an insulator 84 positioned on a substrate 86. Suitable light-transmitting media include, but are not limited to, silicon, polymers, silica, SiN, GaAs, InP and LiNbO$_3$.

The waveguide is partially defined by a ridge of the light-transmitting medium 80 extending upwards from slab regions 88 of the light-transmitting medium 80. The ridge and the base 82 together define a portion of the light signal-carrying region where light signals are constrained within the waveguide. For instance, the ridge of light-transmitting medium 80 can optionally include a cladding 90 with an index of refraction that is less than the index of refraction of the light-transmitting medium 80. Likewise, the insulator 84 can have an index of refraction that is less than an index of refraction of the light-transmitting medium 80. The drop in index of refraction causes light signals being carried within the light signal-carrying region to be reflected back into the light signal-carrying region. Accordingly, the light signal is constrained between the ridge and the insulator 84. Suitable claddings include, but are not limited to, silicon nitride (SiN) and silica (SiO$_2$) and can include one layer or more than one layer of material.

A suitable platform having a structure according to FIG. 4 is a silicon-on-insulator wafer although other platforms can be used. A silicon-on-insulator wafer includes a silicon layer positioned on a base. The silicon layer serves as the light-transmitting medium 80 through which light signals are guided. The base includes a layer of silica positioned on a silicon substrate. The layer of silica can serve as the optical insulator and the silicon substrate can serve as the substrate 86.

An optical device 12 having waveguides constructed according to FIG. 4 can be aligned with the above laser dies 10 using flip chip technology as is disclosed in U.S. Pat. No. 7,658,552 having Ser. No. 12/215,693, filed on Jun. 28, 2008, issued on Feb. 9, 2010, and entitled "Interface Between Light Source and Optical Component;" and U.S. Pat. No. 5,991,484, having Ser. No. 09/264,441, filed on Mar. 8, 1999, issued on Nov. 23, 1999, and entitled "Assembly of an Optical Component and an Optical Waveguide" and U.S. Pat. No. 5,881,190, having Ser. No. 08/853,104, filed on May 8, 1997, issued on Mar. 9, 1999, and entitled "Assembly of an Optical Component and an Optical Waveguide;" each of which is incorporated herein in its entirety.

Although the optical system is disclosed as having multiple device waveguide 18 and multiple laser waveguides 14, an optical system can include a laser die 10 that includes a single laser waveguide 14. The laser waveguide 14 can terminates at one or more facets 56 that are non-perpendicular relative to an optical axis of the laser waveguide 14 and/or that are not co-planar with any crystal planes of the gain medium. As a result, the single laser waveguide 14 can be successfully wavelength tested as disclosed above.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical system, comprising:
   a laser die that includes a gain medium and multiple laser waveguides that are each configured to guide a different laser light signal through the gain medium, each of the laser waveguides outputting a laser light signal at a wavelength
   the laser waveguides being arranged in multiple candidate groups,
      each candidate group including multiple laser waveguides,
      a pattern of wavelength spacing in a first one of the candidate groups is the same as the pattern of wavelength spacing in a second one of the candidate groups, the wavelength spacing being a difference in the wavelength of the light signals that are adjacent to one another on the wavelength spectrum; and
   an optical device that includes multiple device waveguides that are each aligned with one of the laser waveguides so as to receive one of the laser light signals from the aligned laser waveguides,
   a portion of the laser waveguides being inactive in that none of the waveguides on the optical device receives one of the laser light signals from one of the inactive laser waveguides.

2. The system of claim 1, wherein the laser waveguide includes a Bragg grating.

3. The system of claim 1, wherein the laser waveguides terminate at a facet through which the laser light signal exits from the laser waveguide, the facet being non-perpendicular relative to an optical axis of the laser waveguide.

4. The system of claim 3, wherein the gain medium includes crystal planes and the facets are not co-planar with the crystal planes.

5. The system of claim 1, wherein the inactive waveguides are each not optically aligned with any waveguides on the optical device such that that the inactive waveguide and the waveguide on the optical device can exchange light signals.

6. The system of claim 1, further comprising:
   an optical device that includes multiple device waveguides that are each aligned with one of the laser waveguides so as to receive one of the laser light signals from the aligned laser waveguides; and
   electronics in electrical communication with at least a portion of the laser waveguides; and
   wherein a portion of the laser waveguides are active lasers and a portion of the laser waveguides are inactive lasers, the electronics operating the active lasers so as to generate one of the laser light signals but not operating the inactive lasers so as to generate one of the laser light signals.

7. The system of claim 1, wherein the wavelength spacing of the laser waveguides in the first candidate group is less than 1.5 nm.

8. The system of claim 7, wherein the difference between the maximum wavelength of the light signals output by the first candidate group is at least 0.5 nm greater than the maximum wavelength of the light signals output by the second candidate group.

9. An optical system, comprising:
   a laser die that includes a gain medium and multiple laser waveguides that are each configured to guide a different laser light signal through the gain medium, each of the laser waveguides outputting a laser light signal at a wavelength
   the laser waveguides being arranged in multiple candidate groups,
      each candidate group including multiple laser waveguides,
      multiple laser waveguides in a first one of the candidate groups each corresponding to a different one of the laser waveguides in a second one of the candidate groups,
      a difference between the wavelengths of corresponding laser waveguides being the same for each pair of corresponding laser waveguides; and
   an optical device that includes multiple device waveguides that are each aligned with one of the laser waveguides so as to receive one of the laser light signals from the aligned laser waveguides,
   a portion of the laser waveguides being inactive in that none of the waveguides on the optical device receives one of the laser light signals from one of the inactive laser waveguides.

10. The system of claim 9, wherein the laser waveguide includes a Bragg grating.

11. The system of claim 9, wherein the Bragg gratings of laser waveguides in the same candidate group have different pitches.

12. The system of claim 9, wherein the laser waveguides terminate at a facet through which the laser light signal exits from the laser waveguide, the facet being non-perpendicular relative to an optical axis of the laser waveguide.

13. The system of claim 9, wherein the gain medium includes crystal planes and the facets are not co-planar with the crystal planes.

14. The system of claim 1, wherein wherein the inactive waveguides are each not optically aligned with any waveguides on the optical device such that that the inactive waveguide and the waveguide on the optical device can exchange light signals.

15. The system of claim 9, further comprising:
an optical device that includes multiple device waveguides that are each aligned with one of the laser waveguides so as to receive one of the laser light signals from the aligned laser waveguides; and
electronics in electrical communication with at least a portion of the laser waveguides; and
wherein a portion of the laser waveguides are active lasers and a portion of the laser waveguides are inactive lasers, the electronics operating the active lasers so as to generate one of the laser light signals but not operating the inactive lasers so as to generate one of the laser light signals.

16. The system of claim 9, wherein a wavelength spacing of the laser waveguides in the first candidate group is less than 1.5 nm, the wavelength spacing being a difference in the wavelength of the light signals that are adjacent to one another on the wavelength spectrum.

17. The system of claim 16, wherein the difference between the maximum wavelength of the light signals output by the first candidate group is at least 0.5 nm greater than the maximum wavelength of the light signals output by the second candidate group.

18. The system of claim 1, wherein
the laser waveguides in the first candidate group each corresponding to a different one of the laser waveguides in the second candidate group, and
a difference between the wavelengths of corresponding laser waveguides is the same for each pair of corresponding laser waveguides.

19. The system of claim 1, wherein each of the candidate groups is associated with a different target wavelength, the target wavelength being the wavelength that is desired for an active laser selected from the candidate group,
the wavelength spacing being less than 1 nm; and
a spacing of the target wavelengths being greater than 1 nm.

20. The system of claim 9, wherein the gain medium through which the laser signals are guided is continuous.

* * * * *